(12) United States Patent
Yu

(10) Patent No.: US 7,202,713 B2
(45) Date of Patent: Apr. 10, 2007

(54) POWER-ON BIAS CIRCUIT USING SCHMITT TRIGGER

(75) Inventor: Tsung-Hsin Yu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 170 days.

(21) Appl. No.: 10/676,771

(22) Filed: Oct. 1, 2003

(65) Prior Publication Data

US 2005/0073342 A1 Apr. 7, 2005

(51) Int. Cl.
*H03L 7/00* (2006.01)
(52) U.S. Cl. ...................... 327/143; 327/534
(58) Field of Classification Search ........ 327/142–143, 327/198, 534–535, 537
See application file for complete search history.

(56) References Cited

U.S. PATENT DOCUMENTS

| | | | |
|---|---|---|---|
| 5,394,104 A * | 2/1995 | Lee | 327/143 |
| 5,869,978 A * | 2/1999 | Hong | 326/24 |
| 6,492,848 B1 * | 12/2002 | Lee | 327/143 |

* cited by examiner

*Primary Examiner*—Timothy P. Callahan
*Assistant Examiner*—Cassandra Cox
(74) *Attorney, Agent, or Firm*—Tung & Associates

(57) ABSTRACT

A power-on bias circuit including a first inverter having an input terminal and an output terminal, the input terminal functions as an input terminal of the power-up bias circuit; a second inverter having an input terminal and an output terminal, the output terminal of the second inverter functions as the output terminal for the power-on bias circuit; and a Schmitt Trigger circuit having an input terminal and an output terminal, wherein the input terminal of the Schmitt Trigger circuit is connected to the output terminal of the first inverter, the output terminal of the Schmitt Trigger circuit is connected to the input terminal of the second inverter, the first inverter, the second inverter and the Schmitt Trigger circuit are each in electrical communication with a voltage input terminal and ground.

5 Claims, 2 Drawing Sheets

POWER-ON BIAS CIRCUIT USING SCHMITT TRIGGER

FIELD OF THE INVENTION

The present invention generally relates to a semiconductor integrated circuit and more particularly, relates to a semiconductor integrated circuit incorporating a power-on bias circuit utilizing Schmitt trigger.

BACKGROUND OF THE INVENTION

In the operation of electronic circuits, the peripheral circuits on an IC chip are frequently turned on before the core circuits. In the absence of a protection circuit, the peripheral circuits can be damaged by an excessive voltage when no bias voltage is first applied. A power-on bias circuit is therefore used to first bias the peripheral circuits into a high resistance condition prior to being turned on.

A conventional power-on bias circuit may be formed by connecting a number of inverters in series. One of such power-on bias circuit is shown in FIG. 1. A conventional power-on bias circuit 2 may be constructed by four inverters 12, 18, 24 and 30. An input terminal 14 of the inverter 12 is electrically connected to the input terminal 4 of the core circuit. An output terminal 10 of the inverter 30 functions as the output terminal of the power-on bias circuit 2. An output terminal 22 of the inverter 18 is electrically connected to the input terminal 26 of the inverter 24. The output terminal 28 of the inverter 24 is electrically connected to the input terminal 20 of the inverter 18, thus forming a feed-back circuit.

Referring now to FIG. 2 wherein a circuit diagram for the power-on bias circuit 2 of FIG. 1 is shown. As shown in FIG. 2, inverter 12 is constructed by a P-type transistor 34 and an N-type transistor 44. The substrate 42 and the source region 38 of the P-type transistor 34 are electrically connected to an input terminal 6 of the input/output terminal. The substrate 52 and the source region 50 of the N-type transistor 44 are electrically connected to ground 8. The gate 36 of the P-type transistor 34 and the gate 46 of the n-type transistor 44 are electrically connected to the input terminal 14 of the inverter 12. The drain region 40 of the P-type transistor 34 and the drain region 48 of the N-type transistor 44 are electrically connected to the output terminal 16 of the inverter 12.

The inverter 30 is constructed by the P-type transistor 94 and the N-type transistor 104. The substrate 102 and the source region 98 of the P-type transistor 94 are electrically connected to the input terminal 6 of the input/output terminal. The substrate 112 and the source region 110 of the N-type transistor 104 are electrically connected to ground 8. The gate 96 of the P-type transistor 94 and the gate 106 of the N-type transistor 104 are connected to the input terminal 32 of the inverter 30. The drain region 100 of the P-type transistor 94 and the drain region 108 of the N-type transistor 104 are electrically connected to the output terminal 10 of the inverter 30.

The inverter 18 and the inverter 24 forms a feedback loop. The substrate 62 and the source region 58 of the P-type transistor 54 in inverter 18 and the source region 78, the substrate 82 of the P-type transistor 74 in inverter 24 are electrically connected to the input terminal 6 of the input/output terminal. The substrate 72 and source region 70 of N-type transistor 64 in inverter 18 and the substrate 92, source region 90 of the N-type transistor 84 in inverter 24 are electrically connected to ground 8. Furthermore, the gate 56 of the P-type transistor 54 and the gate 66 of the N-type transistor 64 are electrically connected to the input terminal 20 of the inverter 18. The input terminal 20 of inverter 18 and the output terminal 16 of inverter 12 are connected to the output terminal 28 of inverter 24.

Moreover, the gate 76 of the P-type transistor 74 and the gate 86 of the N-type transistor 84 are electrically connected to the input terminal 26 of the inverter 24. The input terminal 26 of the inverter 24 is electrically connected to the input terminal 32 of the inverter 30 and the output terminal 22 of the inverter 18. The output terminal 22 of the inverter 18 is formed by electrically connecting the drain region 60 of the P-type transistor 54 and the drain region 68 of the N-type transistor 64 together. The output terminal 28 of inverter 24 is formed by electrically connecting the drain region 80 of the P-type transistor 74 and the drain region 88 of the N-type transistor 84 together.

In the operation of the power-on bias circuit 2, a high potential voltage signal is inputted into the input terminal 6 of the input/output terminal of the peripheral circuit. A voltage applied to the voltage input terminal 4 of the core circuit is determined by whether the core circuit is turned on. For instance, when the core circuit is not turned on, the voltage at the input terminal 4 is at a low potential. When the core circuit is turned on, the voltage at the voltage input terminal 4 is at a high potential.

Since inverter 18 and inverter 24 form a feedback circuit, the power-on bias circuit 2 presents a hysteresis characteristic. However, since inverter 18 and inverter 24 interfere with each other, the hysteresis characteristic of the power-on bias circuit 2 is poor such that the anti-noise capability of the circuit is poor. Furthermore, since the voltage potential at the input terminal 6 of the input/output terminal is maintained at a high potential, the leakage current that flows through inverter 12 is not reduced. The power consumption of the power-on bias circuit 2 is likewise not reduced.

It appears that while a smaller leakage current is present in a power-on bias circuit formed by inverters connected in series, the anti-noise capability of the power-on bias circuit is poor. In another conventional power-on bias circuit utilizing an inverter feedback circuit and two inverters connected in series, while the anti-noise capability is improved due to the hysteresis characteristics, the leakage current become larger which leads to higher power consumption.

It is therefore an object of the present invention to provide a power-on bias circuit that is capable of producing a smaller leakage current and improved hysteresis characteristics.

It is another object of the present invention to provide a power-on bias circuit that does not have the drawbacks or shortcomings of the conventional power-on bias circuit.

It is a further object of the present invention to provide a method for operating a power-on bias circuit by incorporating a Schmitt trigger circuit such that the hysteresis window of the circuit is enlarged to improve the anti-noise capability and to reduce the leakage current.

SUMMARY OF THE INVENTION

In accordance with the present invention, a power-on bias circuit and a method for operating the circuit are provided.

In a preferred embodiment, the invention provides a power-on bias circuit that includes a first inverter, an input terminal of the first inverter functions as the core voltage input terminal for the power-on bias circuit; a second inverter, an output terminal of the second inverter functions as an output terminal of the power-on bias circuit; a Schmitt trigger circuit which includes a first P-type transistor and a second P-type transistor, wherein a substrate of the second P-type transistor, a substrate and a source region of the first P-type transistor are electrically connected to an input terminal of an input/output terminal of the power-on bias circuit; a source region of the second P-type transistor is electrically connected to the drain region of the first P-type transistor; a first N-type transistor and a second N-type transistor, wherein a gate of the first P-type transistor, a gate of the second P-type transistor, a gate of the first N-type transistor and a gate of the second N-type transistor are electrically connected to the input terminal of the Schmitt trigger circuit; an input terminal of the Schmitt trigger circuit is electrically connected to the output terminal of the first inverter, a substrate of the second N-type transistor, a substrate and a source region of the first N-type transistor are electrically connected to ground; a source region of the second N-type transistor is electrically connected to a drain region of the first N-type transistor; a third P-type transistor having a source region electrically connected to both the drain region of the first P-type transistor and the source region of the second P-type transistor; a drain region of the third P-type transistor is electrically connected to ground; a substrate of the third P-type transistor is electrically connected to an input terminal of an input/output terminal of the power-on bias circuit; a third N-type transistor having a source region electrically connected to both a drain region of the first N-type transistor and a source region of the second N-type transistor, a drain region of the third N-type transistor is electrically connected to an input terminal of an input/ output terminal of the power-on bias circuit, a substrate of the third N-type transistor is electrically connected to the ground, a drain region of the second P-type transistor, a drain region of the second N-type transistor, a gate of the third P-type transistor and a gate of the third N-type transistor are electrically connected to the output terminal of the Schmitt trigger circuit; the output terminal of the Schmitt trigger circuit is electrically connected to an input terminal of the second inverter. The first inverter and the second inverter can both be formed by a P-type transistor and an N-type transistor.

The present invention is further directed to a method for operating a power-on bias circuit including the steps of providing a power-on bias circuit; inputting a first voltage signal into the input terminal of the input/output terminal, inputting a second voltage signal into the core voltage input terminal, where the first voltage signal is high potential and the second voltage signal is low potential, a third voltage signal of high potential is outputted from the first inverter into the Schmitt trigger circuit, the first N-type transistor, the second N-type transistor and the third P-type transistor in the Schmitt trigger circuit are turned on; while the first P-type transistor, the second P-type transistor and the third N-type transistor are turned off; a fourth voltage signal of low potential is outputted from the Schmitt trigger circuit into the second inverter. Lastly, a fifth voltage signal of high potential is outputted from the second inverter as an output of the power-on bias circuit.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
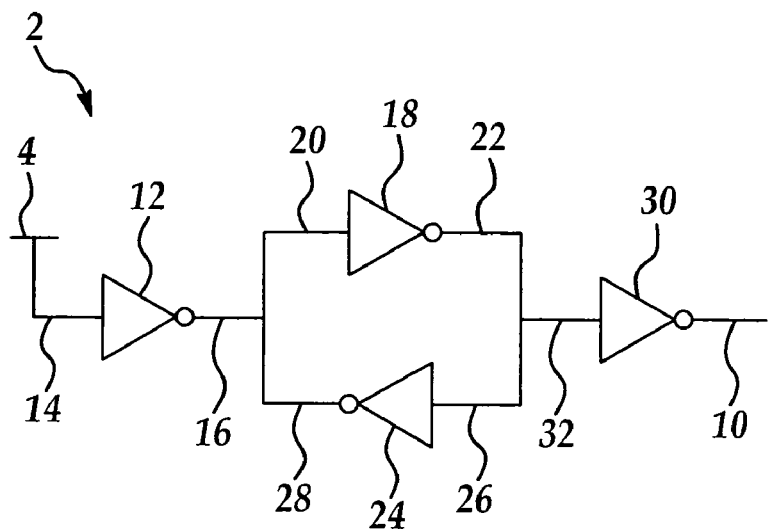
FIG. 1 is a schematic illustrating a block diagram for a conventional power-on bias circuit.
Figure 2:
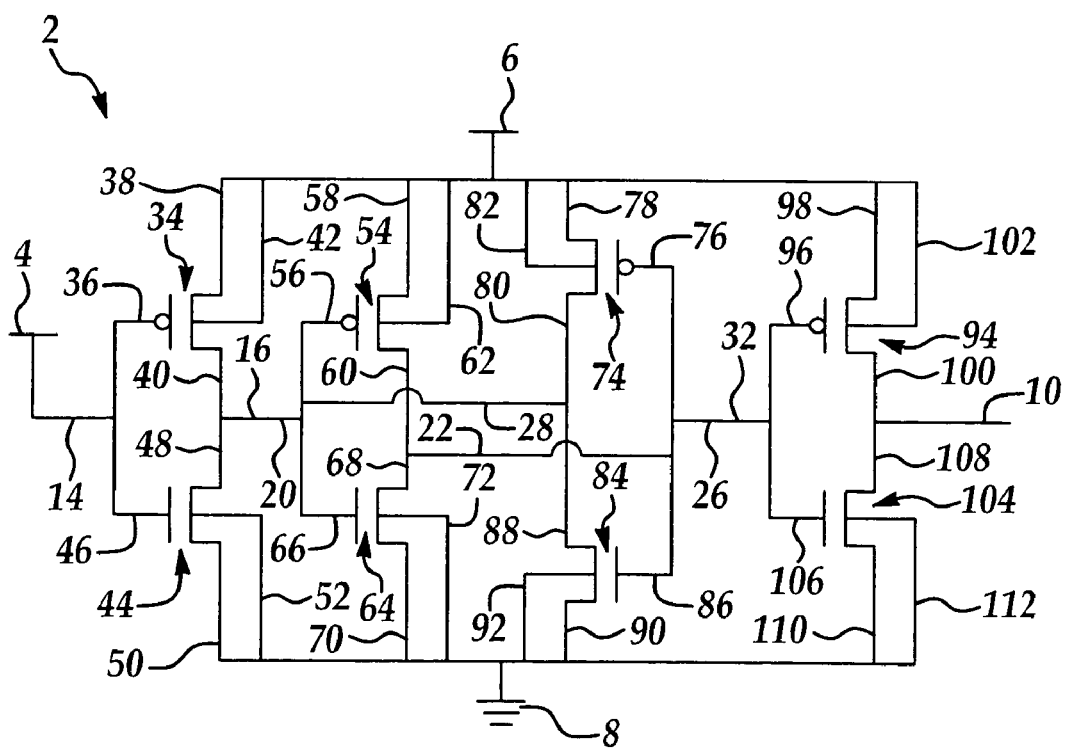
FIG. 2 is a schematic illustrating a detailed circuit diagram for the conventional power-on bias circuit of FIG. 1.
Figure 3:
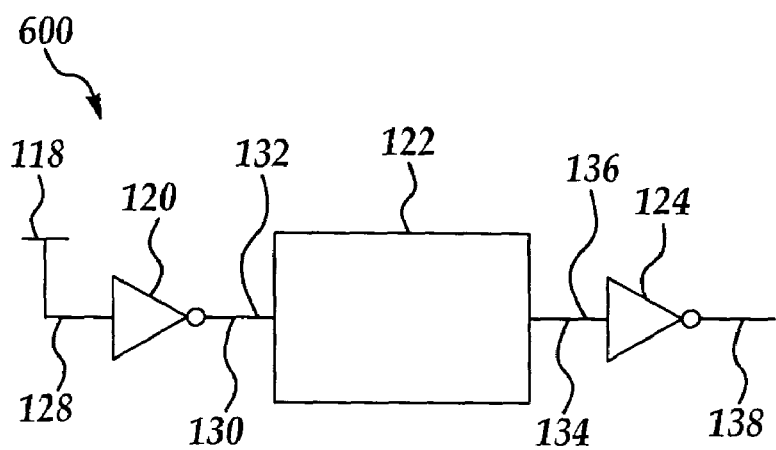
FIG. 3 is a schematic illustrating a block diagram for the present invention power-on bias circuit.

Referring initially to FIG. 3, wherein an implementation example of the present invention power-on bias circuit is shown in a block diagram. The present invention power-on bias circuit 600 is constructed by a Schmitt trigger circuit 122 and two inverters 120, 124. Detailed circuit diagrams for the inverters 120, 124 and the Schmitt trigger circuit 122 are shown in FIG. 4.

Figure 4:
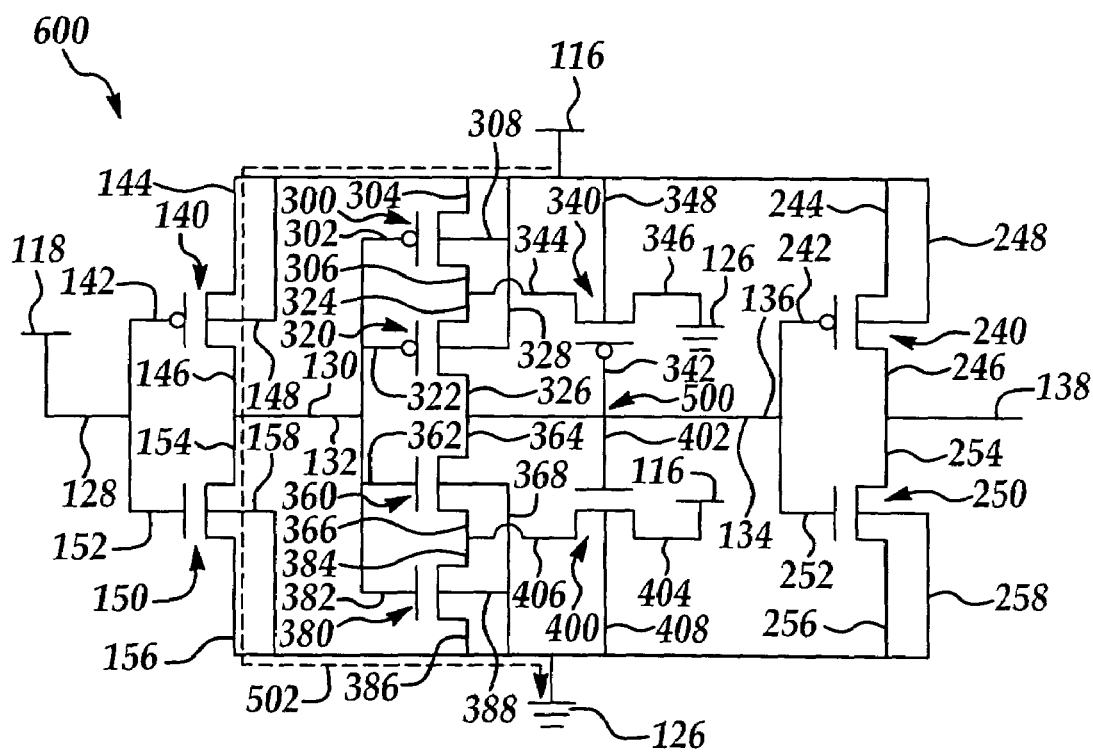
FIG. 4 is a schematic illustrating a detailed circuit diagram for the present invention power-on biased circuit of FIG. 3.

As shown in FIG. 4, inverter 120 is constructed by a P-type transistor 140 and an N-type transistor 150, while inverter 124 is constructed by P-type transistor 240 and N-type transistor 250. The Schmitt trigger circuit 122 is constructed by a P-type transistor 300, P-type transistor 320, P-type transistor 340, N-type transistor 360, N-type transistor 380 and N-type transistor 400. The gate 142 and the gate 152 of the P-type transistor 140 and the N-type transistor 150, respectively are used as the input terminal 128 of the inverter 120 and are electrically connected to the core voltage input terminal 118. The source region 144 and the substrate 148 of the P-type transistor 140 are electrically connected to the input terminal 116 of the input/output terminal. The source region 156 and the substrate 158 of the N-type transistor 150 are electrically connected to ground 126. The drain region 146 of the P-type transistor 140 and the drain region 154 of the N-type transistor 150 are used as the output terminal 130 of the inverter 120, and are electrically connected to the input terminal 132 of the Schmitt trigger circuit 122.

The gate 242 of the P-type transistor 240 and the gate 252 of the N-type transistor 250 are used as the input terminal 136 for the inverter 124, and are electrically connected to the output terminal 134 of the Schmitt trigger circuit 122. The source region 244 and the substrate 248 of the P-type transistor 240 are electrically connected to the input terminal 116 of the input/output terminal. The source region 256 and the substrate 258 of the N-type transistor 250 are electrically connected to ground 126. The drain region 246 of the P-type transistor 240 and the drain region 254 of the N-type transistor 250 are electrically connected to the output terminal 138 of the power-on bias circuit 600.

The Schmitt trigger circuit 122 is constructed by P-type transistor 300, P-type transistor 320, P-type transistor 340, N-type transistor 360, N-type transistor 380 and N-type transistor 400. The gate 302 of the P-type transistor 300, the gate 322 of the P-type transistor 320, the gate 362 of the N-type transistor 360 and the gate 382 of the N-type transistor 380 are electrically connected to the input terminal 132 of the Schmitt trigger circuit 122. The substrate 328 of the P-type transistor 320, the source region 304 and the substrate 308 of the P-type transistor 300 are connected to the input terminal 116 of the input/output terminal. The substrate 368 of the N-type transistor 360, the source region 386 and the substrate 388 of the N-type transistor 380 are electrically connected to ground 126.

The drain region 326 of the P-type transistor 320, the drain region 364 of the N-type transistor 360, the gate 342 of the P-type transistor 340 and the gate 402 of the N-type transistor 400 are electrically connected to the output terminal 134 of the Schmitt trigger circuit 122. The source region 344 of the P-type transistor 340, the source region 324 of the P-type transistor 320 and the drain region 306 of the P-type transistor 300 are electrically connected together. The drain region 346 of the P-type transistor 340 is electrically connected to ground 126. The substrate 348 of the P-type transistor 340 is electrically connected to the input terminal 116 of the input/output terminal. The source region 406 of the N-type transistor 400, the source region 366 of the N-type transistor 360 and the drain region 384 of the N-type transistor 380 are electrically connected together, the drain region 404 of the N-type transistor 400 is electrically connected to the input terminal 116 of the input/output terminal while the substrate 408 of the N-type transistor 400 is electrically connected to ground 126.

When the peripheral circuits are first turned on before the turn on of the core circuits, a voltage signal of high potential is applied to the input terminal 116 of the input/output terminal. The voltage at the core voltage input terminal 118 is still maintained at a low potential, while the input terminal 128 of inverter 120 receives the low potential voltage signal, the P-type transistor 140 is turned on while the N-type transistor 150 is turned off. The output terminal 130 of the inverter 120 is charged by the high potential voltage at the input terminal 116 of the input/output terminal.

When the voltage at the output terminal 130 of the inverter 120 is increased to the high hysteresis voltage of the Schmitt trigger circuit 122, the P-type transistor 300 and the P-type transistor 320 are turned off, while the N-type transistor 360 and the N-type transistor 380 are turned on. The drain region 326 of the P-type transistor 320, the drain region 364 of the N-type transistor 360, the gate 342 of the P-type transistor 340 and the gate 402 of the N-type transistor 400 are connected together at node 500 where the electrical potential is pulled down by the N-type transistor 360 and the N-type transistor 380 to the ground 126. A low potential electrical voltage is thus present which causes the N-type transistor 400 to turn off and the P-type transistor 340 to turn on. A low potential voltage signal is thus outputted from the output terminal 134 of the Schmitt trigger circuit 122 to the inverter 124.

After a low potential voltage signal is received by the input terminal 136 of the inverter 124, the P-type transistor 240 is turned on while the N-type transistor 250 is turned off. A high potential voltage signal at the input terminal 116 of the input/output terminal is outputted from the output terminal 138 of the power-on bias circuit 600 through the P-type transistor 240. The high potential voltage signal can thus control the operation of the circuit such that leakage current can be reduced before the core circuits are turned on.

When the voltage at the input terminal 116 of the input/output terminal is maintained at a high potential, and when the voltage at the core voltage input terminal 118 is maintained at a low potential, the power-on bias circuit 600 is activated such that its output terminal 138 is maintained at a high potential voltage signal to stabilize the power-on biased circuit 600.

When the core circuits are turned on, by the application of a high potential voltage signal on the core voltage input terminal 118, and simultaneously maintaining a high potential voltage at the input terminal 116 of the input/output terminal, the N-type transistor 150 of the inverter 120 is turned on. However, since the high potential voltage signal applied to the core voltage input terminal 118 is lower than the high potential voltage signal applied to the input terminal 116 of the input/out terminal, and since the substrate 148 and the source region 144 of the P-type transistor 140 are electrically connected to the input terminal 116 of the input/output terminal, as a result, even though the gate 142 of the P-type transistor 140 receives a high potential voltage signal, the P-type transistor 140 is not completely turned off. A small leakage current 502 flows from the P-type transistor 140 through the N-type transistor 150 to the ground 126.

In order to reduce the leakage current 502, the dimension of the N-type transistor 150 is fabricated such that it is larger than the dimension of the P-type transistor 140 during the fabrication of the two transistors. By the reduction in the dimension of the P-type transistor 140, the leakage current 502 can be reduced.

Since N-type transistor 150 is turned on, the high voltage signal at the output terminal 130 of the inverter 120 is discharged at ground 126 through the N-type transistor 150. When the voltage at the output terminal 130 of the inverter 120 is reduced to the low hysteresis voltage of the Schmitt trigger circuit 122, the N-type transistor 360 and the N-type transistor 380 of the Schmitt trigger circuit 122 are turned off, while the P-type transistor 300 and the P-type transistor 320 are turned on. The high potential voltage signal at the input terminal 116 of the input/output terminal charges node 500 through the P-type transistor 300 and the P-type transistor 320 such that the node 500 presents a high potential voltage causing the P-type transistor 340 to turn off and the N-type transistor 400 to turn on. A high potential voltage signal is outputted from the output terminal 134 of the Schmitt trigger circuit 122 to the inverter 124.

When a high potential voltage signal is received from the input terminal 136 of the inverter 124, the P-type transistor 240 is turned off while the N-type transistor 250 is turned on, thus to activate the output of a low potential voltage signal from the output terminal 138 of the power-on bias circuit 600 and to stop controlling the other circuits. At this stage, both the peripheral circuits and the core circuits are turned on.

The effectiveness of the present invention power-on bias circuit is shown in Table 1 by data obtained on conventional power-on bias circuit and on present invention power-on bias circuit. The data presented includes the leakage current and the hysteresis window.

TABLE 1

|  | Leakage Current | Hysteresis Window |
| --- | --- | --- |
| 1$^{ST}$ Conventional Power-on bias circuit | <2 µA | 0 mV |
| 2$^{nd}$ Conventional Power-on bias circuit | <10 µA | 200 mV |
| Present Invention Power-On bias circuit | <2 µA | 400 mV |

The data indicates that by the conventional technique of connecting inverters in series as the power-on biased circuit, even though a smaller leakage current is obtained, there is no improvement in anti-noise immunity since no hysteresis characteristic is utilized. In the second conventional power-on bias circuit wherein a hysteresis window is utilized, a large leakage current is resulted while the hysteresis window is limited to about 200 mV at higher power consumption. In the present invention power-on bias circuit, not only a smaller leakage current is obtained, a large hysteresis window is also obtained such that there is sufficient anti-noise immunity and a low power consumption.

The present invention power-on bias circuit presents numerous benefits by using a Schmitt trigger circuit. The benefits include smaller leakage current and a wider hysteresis window, an improved anti-noise immunity and a low power consumption. The drawbacks of the conventional power-on bias circuit of large leakage current and poor hysteresis window have thus been remedied.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A power-on bias circuit comprising:
   a first inverter having an input terminal and an output terminal, said input terminal of the first inverter functions as a first voltage input terminal for said power-on bias circuit;
   a second inverter having an input terminal and an output terminal, wherein said output terminal of said second inverter functions as an output terminal for said power-on bias circuit; and
   a Schmitt Trigger circuit comprising:
   a first P-type transistor;
   a second P-type transistor, wherein a substrate of said second P-type transistor, a substrate and a source region of said first P-type transistor are electrically connected to a second voltage input terminal of said power-on bias circuit, a source region of the second P-type transistor is electrically connected to a drain region of said first P-type transistor; wherein the second voltage input terminal receives a voltage signal of high potential when peripheral circuits are turned on before turning on core circuits, wherein the first voltage input terminal receives the voltage signal of high potential when the core circuits are turned on;
   a first N-type transistor;
   a second N-type transistor, a gate of said first P-type transistor, a gate of said second P-type transistor, a gate of said first N-type transistor and a gate of said second N-type transistor are electrically connected to said input terminal for said Schmitt Trigger circuit, said input terminal of the Schmitt Trigger circuit is electrically connected to said output terminal of said first inverter, a substrate of said first N-type transistor, a substrate and a source region of said second N-type transistor are electrically connected to ground, a drain region of said second N-type transistor is electrically connected to a source region of said first N-type transistor;
   a third P-type transistor, a source region of said third P-type transistor is electrically connected to said drain region of the first P-type transistor and said source region of the second P-type transistor, a drain region of said third P-type transistor is electrically connected to ground, a substrate of said third P-type transistor is electrically connected to said second voltage input terminal of said power-on bias circuit; and
   a third N-type transistor, a source region of said third N-type transistor is electrically connected to a source region of said first N-type transistor and a drain region of said second N-type transistor, a drain region of said third N-type transistor is electrically connected to said second voltage input terminal of said power-on bias circuit, a substrate of said third N-type transistor is electrically connected to ground, a drain region of said second P-type transistor, a drain region of said first N-type transistor, a gate of said third P-type transistor and a gate of said third N-type transistor are electrically connected to said output terminal of the Schmitt Trigger circuit, said output terminal of the Schmitt Trigger circuit is electrically connected to said input terminal of the second inverter.

2. A power-on bias circuit according to claim 1, wherein said first inverter comprises a fourth P-type transistor and a fourth N-type transistor, a substrate and a source region of said fourth P-type transistor is electrically connected to said second voltage input terminal of the power-on bias circuit, a source region of said fourth N-type transistor is electrically connected to ground, a gate of said fourth P-type transistor and a gate of said fourth N-type transistor are electrically connected to said input terminal of said first inverter, a drain region of said fourth P-type transistor and a drain region of said fourth N-type transistor are electrically connected to said output terminal of said second inverter.

3. A power-on bias circuit according to claim 1, wherein said second inverter comprises a fourth P-type transistor and a fourth N-type transistor, a substrate and a source region of said fourth P-type transistor is electrically connected to said second voltage input terminal of the power-on bias circuit, a source region of said fourth N-type transistor is electrically connected to ground, a gate of said fourth P-type transistor and a gate of said fourth N-type transistor are electrically connected to said input terminal of said second inverter.

4. A power-on bias circuit according to claim 1, wherein said first voltage input terminal of the power-on-bias circuit is a core voltage input terminal, said second voltage input terminal of the power-on-bias circuit is an input terminal of an input/output terminal.

5. A power-on bias circuit according to claim 2, wherein dimension of the fourth N-type transistor is larger than dimension of the fourth P-type transistor to reduce a leakage current flowing from the second voltage input terminal to the ground.

* * * * *